Feb. 8, 1955 R. H. HAGOPIAN 2,701,842
SPECIAL TANK CIRCUIT FOR HIGH Q DIELECTRIC LOADS
Filed Aug. 30, 1949
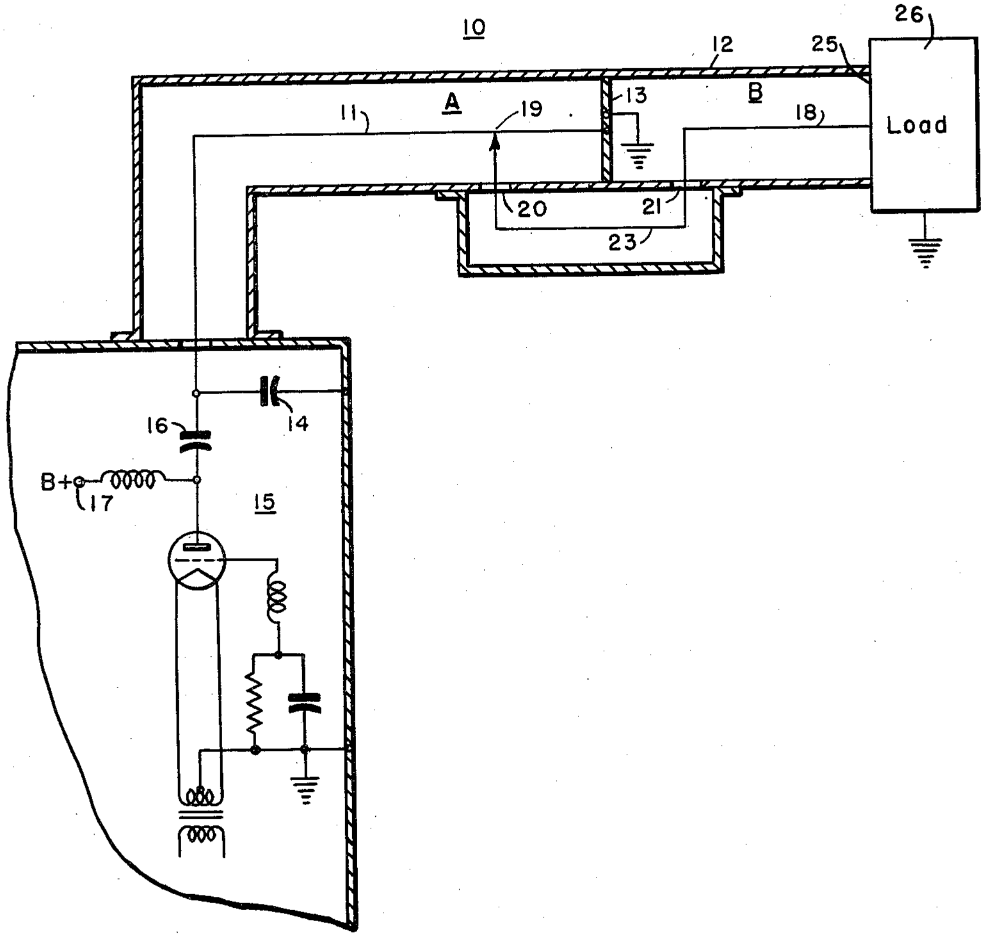
WITNESSES:
E. A. McCloskey
Raymond G. Brodsky
INVENTOR
Richard H. Hagopian.
BY
F. E. Browder
ATTORNEY United States Patent Office 2,701,842

Patented Feb. 8, 1955

2,701,842

SPECIAL TANK CIRCUIT FOR HIGH Q DIELECTRIC LOADS

Richard H. Hagopian, Baltimore, Md., assignor to Westinghouse Electric Corporation, East Pittsburgh, Pa., a corporation of Pennsylvania Application August 30, 1949, Serial No. 113,175

5 Claims. (Cl. 250—36)

My invention relates generally to transmission lines, and more particularly to improved high frequency tank circuits for use with high Q dielectric loads. It is desirable that the generator which supplies such loads shall maintain its frequency within narrow limits.

In apparatus constructed in accordance with the teachings of the prior art of which I am aware, difficulty is encountered in meeting this condition by reason of "pulling"; that is the oscillator frequency varies substantially with changes in the kva. of the load circuit. This variation is manifested as a sudden shift in the oscillator frequency by an amount dependent upon the load conditions and the degree of coupling between the load and the generator. As the frequency shifts the dielectric load presents to the oscillator feeding it a changing load pattern as the power flowing into the load varies.

One of the main objects of my invention is to provide a dielectric heating system in which the frequency of the oscillator shall be maintained within narrow limits.

Another object of my invention is to provide a dielectric heating system in which the pulling of the supply oscillator shall be suppressed.

An additional object of my invention is to provide apparatus for supplying a highly reactive load which draws substantial real power from an oscillation generator in the operation of which the frequency of the generator shall be maintained within narrow limits.

A further object of my invention is to provide apparatus for supplying a high Q load which absorbs substantial real power from an oscillator in the operation of which the frequency of the oscillator shall be maintained stable within narrow limits.

An ancillary object of my invention is to provide a novel coupling between an oscillation generator and a high Q load.

My invention arises from the realization that the frequency instability can be reduced by providing between the oscillator and the load a separate tank circuit which has a high effective Q. This tank circuit functions as a buffer between the load and the oscillator to suppress pulling. As the load in the present situation is highly reactive (has a high Q) the provision of a high Q tank circuit between the oscillator and the load constitutes effective coupling between the oscillator and the load. The tendency for a sudden shift of frequency to occur is decreased as the tank Q is increased, provided other factors are kept constant.

The novel features which I believe to be characteristic of my invention are set forth with particularity in the appended claims; the invention itself, however, as to both its organization and method of operation will best be understood by reference to the following description, taken in connection with the drawing, in which I have indicated schematically the circuit organization whereby my invention may be carried into effect.

The single figure is a schematic diagram of a load coupling circuit connected in accordance with my invention.

The apparatus shown in the figure includes a transmission line 10 having an inner connector 11 and an outer conductor 12. This transmission line 10 is divided into two segments A and B. The first segment A or section should have a low surge impedance and be approximately one-eighth wavelength long. A short circuiting member 13 which is grounded is provided at one end of the said first segment. At the opposite end is a capacitor 14 connected between the conductors. This portion of the line may now be used as the tank circuit of the oscillation generator 15.

The oscillator 15 may be of the common type employing a triode discharge device. A blocking condenser 16 is placed in the output circuit to prevent the flow of the high voltage D. C. plate supply 17 current into the tank circuit, and resultant short circuiting of the supply voltage thereby.

The second section B of transmission line may have a common outer conductor with the above said first section, but the inner conductor 18 is not common to the inner conductor 11 of the first section. The inner conductor 18 of the second section B is coupled or connected to the inner conductor 11 of the first section at a point 19 along the latter conductor 11 a short distance away from the grounded and short circuited end 13. If the outer conductors of the two line sections A and B are common, this coupling connection 23 may be made through holes 20 and 21 in the outer conductor 12. The second section B of line may have any desired surge impedance, and any reasonable length which is necessary to connect the generator to the load. If this length of line is between ⅛ and ¼ wavelength, the load 26 may be matched to the generator 15 by simply parallel tuning the load 26 to an effective high impedance, the latter being somewhat higher than the surge impedance of the line. If a sufficiently high impedance is presented between these conductors at this open end 25, the load 26 may readily be coupled to the high impedance point.

The operation of the circuit shown in Fig. 1 is as follows. The operation of the oscillator 15 as a power generating device is similar to that well known in the art. The short circuited first section A of the transmission line is of such a length as to appear inductive at the desired frequency of oscillation. The end of this line nearest the oscillator plate element is shunted to ground through a capacitor 14, to give the combination therewith the effect of a resonant circuit which determines the frequency of oscillation. This is the high Q tank circuit for the oscillator 15. The Q of this tank circuit will depend on the length of short-circuited transmission line A used. The shorter the line used, the greater will have to be the value of the shunt capacitor 14 to effect the resonant circuit for the desired frequency of oscillation. In practice such lines A of approximately one-eighth wavelength have been used; however, this figure is arbitrarily chosen, and any length line having a sufficiently inductive characteristic at the operating frequency will perform satisfactorily.

The second section B of the line couples the high Q tank circuit to result in the most favorable transfer of energy to the load 26. This second section B of the line is of any necessary reasonable length. If this second section of line is between ⅛ and ¼ wavelength, and if the load is tuned to an effectively high impedance, which would be higher than the surge impedance of line B, then the load 26 can be readily connected to this second line section B. The opposite end of this latter line section is coupled to the first line section A at a point 19 away from the short circuited end B where a sufficient impedance is presented between the respective conductors 11 and 12 of said first line section A to assure a satisfactory transfer of energy through the coupling 23 to the second line section B and high kva. load 26.

By providing the high Q transmission line tank circuit for the oscillator 15, when the high Q load 26 is coupled to it through the second line section B the oscillator 15 is not rendered instable thereby. This combination reduces the pulling effect of the load 26 to change the frequency with variations in the loading.

While I have shown and described one particular system for carrying my invention into effect, it will be apparent to one skilled in the art that my invention is by no means limited to the particular organization shown and described, but that many modifications may be made without departing from the scope of my invention. My invention, therefore, is not to be limited except insofar as is necessitated by the prior art and the spirit of the appended claims.

I claim as my invention:

1. In a transmission line system, a transmission line having an inner and an outer conductor member with said inner conductor having a first portion and a second portion, a short circuiting member placed between said first portion of said inner conductor and said outer conductor at such a position that the input impedance looking from one end of the line toward the said short circuiting member is inductive, a capacitor connected between the said first portion of said inner conductor and said outer conductor at the said one end of the line to effect a resonant tank circuit with the said inductive shorted section of the line, and a coupling connector fastened between said second portion of the inner conductor and a point on said first portion of the inner conductor, with said point being located on said first portion of said inner conductor between the said end of the line and the short circuiting member.

2. Apparatus for coupling a load to a high-frequency oscillator, especially for use with dielectric heating loads, comprising a transmission line having an inner and an outer conductor, said inner conductor having a first portion and a second portion, a short-circuiting member dividing said outer conductor into a first section and a second section, the latter section being coextensive with said first section, said short-circuiting member being connected between the said first portion of said inner conductor and the outer conductor of the first line section at a position along the last-said line section such that the input impedance of the first line-section between the oscillator and the short-circuiting member is inductive, a capacitor connected between the conductors of said first line-section at the end of said first-line section provided for connection to said oscillator, said capacitor cooperating with the inductance of said first line-section to provide a resonant tank circuit for the oscillator, and coupling means connecting the second portion of the inner conductor in the second line-section to the first portion of the inner conductor in said first line-section at a predetermined point on said first portion of said inner conductor, with said point being removed from said short-circuiting member, and at which point sufficient impedance is presented between the first portion of said inner conductor and said outer conductor so that an efficient power transfer between the two line sections can be effected.

3. Apparatus as claimed in claim 2, wherein said load is coupled to the second line-section at a position along said second line-section at which a maximum impedance is offered between the inner and outer conductors thereof.

4. In an impedance matching network, a short circuited transmission line having an input end and an inductive impedance, said short circuited transmission line comprising a first transmission line having a pair of conductor members and a short circuiting member connected between said conductor members at a predetermined position along said first transmission line and away from said input end thereof, a capacitor connected across the input end of the line to adapt said short circuited transmission line to function as a resonant tank circuit for an oscillator, a second transmission line adapted to be connected to a load, and a conducting member connected between the short circuited transmission line and the second transmission line, said conducting member being connected to said first transmission line at a position along that line between the short circuiting member and said input end.

5. In an impedance matching circuit for use between a parallel tuned dielectric load and a power source having a loaded Q which is less than the Q of said load, the combination of a first transmission line having a parallel first inner and a first outer conductor and an input end, a short-circuiting member positioned between the said first inner conductor and first outer conductor at such a position along said line that the resultant input impedance of that line is inductive, with said short-circuiting member terminating said first transmission line, and a capacitive member connected between said first inner conductor and said first outer conductor at the input end of said line, thereby providing the line as a resonant tank circuit for said power source, a second transmission line for connection to the load, with said second transmission line having a parallel second inner and second outer conductor, said first and second outer conductors being coextensive, and a coupling connection between said second inner conductor and a predetermined point along the first inner conductor of the first transmission line, said point being so located on the first inner conductor such that a sufficient impedance is presented between said first inner and first outer conductors so that an efficient transfer of energy from said first transmission line to said second transmission line will be effected through said coupling conductor.

References Cited in the file of this patent

UNITED STATES PATENTS

| | | |
|---|---|---|
| 2,011,942 | George | Aug. 20, 1935 |
| 2,141,242 | George et al. | Dec. 27, 1938 |
| 2,222,169 | Bushbeck | Nov. 19, 1940 |
| 2,373,233 | Dow et al. | Apr. 10, 1945 |
| 2,414,991 | Wheeler | Jan. 28, 1947 |
| 2,419,793 | Rosencrans | Apr. 29, 1947 |
| 2,483,189 | Eaglesfield | Sept. 27, 1949 |
| 2,509,253 | Schriefer | May 30, 1950 |